United States Patent [19]

Reinhardt et al.

[11] Patent Number: 4,473,782

[45] Date of Patent: Sep. 25, 1984

[54] DRIVE CIRCUIT FOR BRUSHLESS DIRECT-CURRENT MOTORS

[75] Inventors: Wilhelm Reinhardt, Schrozberg; Helmut Lipp, Hohebach; Friedrich O. U. Rüdele, Weissbach, all of Fed. Rep. of Germany

[73] Assignee: ebm Elektrobau Mulfingen GmbH & Co., Fed. Rep. of Germany

[21] Appl. No.: 461,029

[22] Filed: Jan. 26, 1983

[30] Foreign Application Priority Data

Feb. 4, 1982 [DE] Fed. Rep. of Germany ....... 3203829

[51] Int. Cl.³ .............................................. H02P 6/02
[52] U.S. Cl. .................................... 318/254; 318/138; 318/434; 318/439
[58] Field of Search ................... 318/138, 254, 254 A, 318/439, 434; 361/23, 28, 29, 33

[56] References Cited

U.S. PATENT DOCUMENTS

| | | | |
|---|---|---|---|
| 3,644,808 | 2/1972 | Favre | 318/138 |
| 3,716,769 | 2/1973 | Brunner | 318/138 X |
| 4,132,930 | 1/1979 | Schalk | 318/138 |

FOREIGN PATENT DOCUMENTS

| | | | |
|---|---|---|---|
| 2361645 | 7/1974 | Fed. Rep. of Germany | 361/28 |
| 2419432 | 10/1975 | Fed. Rep. of Germany | 318/138 |
| 89913 | 8/1978 | Japan | 318/138 |

Primary Examiner—J. V. Truhe
Assistant Examiner—Bentsu Ro
Attorney, Agent, or Firm—Goodman & Teitelbaum

[57] ABSTRACT

A drive circuit for brushless direct-current motors having a cylinder-like air gap between a permanent magnetic inner or outer rotor and a stator, the stator windings being connected to a supply direct-current source in series with a respective feed transistor. The current flux depends on position signals from a semiconductor control element determining the rotor position, in particular a Hall IC, and on the switching state of a semiconductor switch responding to blocking of the rotor and serving as blocking protection for the stator windings. In order to avoid a thermal overload of the stator windings and of the semiconductor elements contained in the circuit, the semiconductor switch provided as the blocking protection is a transistor. The emitter/collector path of the blocking protection transistor is in series with the stator windings and the feed transistors associated with each of these stator windings, and the base of the blocking protection transistor receives an inductive voltage generated in the stator windings.

7 Claims, 2 Drawing Figures

DRIVE CIRCUIT FOR BRUSHLESS DIRECT-CURRENT MOTORS

This invention relates to a drive circuit for brushless direct-current motors having a cylinder-like air gap between a permanent magnetic inner or outer rotor and a stator, the stator windings being connected to a supply direct-current source in series with a respective feed transistor.

A drive circuit of this type is known in the prior art, this prior art drive circuit being shown in FIG. 1. In this known circuit, the feed transistors 10, 11 for the stator windings 12, 13 are connected with a semiconductor control element 14 for the determination of the rotor position, in each case, through one of the two transistors 16, 18 forming a differential amplifier 20. Each of these latter transistors contains in its base circuit, a coupling capacitor 22, 24 with a divided charging and discharging circuit. These coupling capacitors have valves, that with a running motor, they do not differentiate the setting signal transferred by them from the semiconductor control element. In a blocking of the rotor the coupling capacitor associated with the conducting transistor of the differential amplifier, is charged and brings about, in this manner, a blocking of the corresponding transistor of the differential amplifier, and thereby also, a lowering of the operating current in the corresponding feed transistor and the stator winding connected in series with it. The current of the differential amplifier is taken over by another transistor 26, connected in parallel with its emitter/collector path, to the transistors of the differential amplifier together with a protective diode 28, 30 connected in series, which other transistor takes over in this manner a blocking protective function for the stator windings, as it makes possible a lowering of the operating current. In this manner of connection, the transistors coupled with the charging coupling capacitor, work in amplifier operation, and, therefore, during the capacitor charging, there can occur an exceeding of the maximum allowable performance loss for the transistors involved, and thereby result in the thermal destruction of these transistors.

Underlying the invention, therefore, is the problem of forming a drive circuit of the type mentioned above, in such a way, that it ensures an efficient blocking protection not only for the stator windings, but also for all the transistors connected therewith.

The problem posed above is solved according to the present invention, whereby advantageous further development of the present invention are also yielded. It is of especial significance, that for the protection of the personnel possibly working at the ventilator, a starting is made possible only after a complete switch-off and reengagement of the d.c. motor, which occurs after suspension of the rotor blocking through the interconnecting of the base of the blocking protection transistor to the supply direct-current source through an RC circuit having suitable valves.

Furthermore, it is of special importance that on engagement of the operating voltage, a safe starting is ensued even if the voltage rise of the operating voltage occurs slowly.

Further, it is to be emphasized that on blocking of the motor, an abrupt switch-off of the windings occurs, so that as a consequence of the substantially lower performance loss, smaller and less expensive power transistors can be used.

A further substantial advantage is to be seen in that also in the case of a breakdown of the collector-emitter paths of the feed transistors, the blocking protection transistor takes over the protection of the windings.

With the above and additional objects, and advantages in view, as will hereinafter appear, this invention comprises the devices, combinations and arrangements of parts hereinafter described by way of example and illustrated in the accompanying drawing of a preferred embodiment in which.

Figure 1:
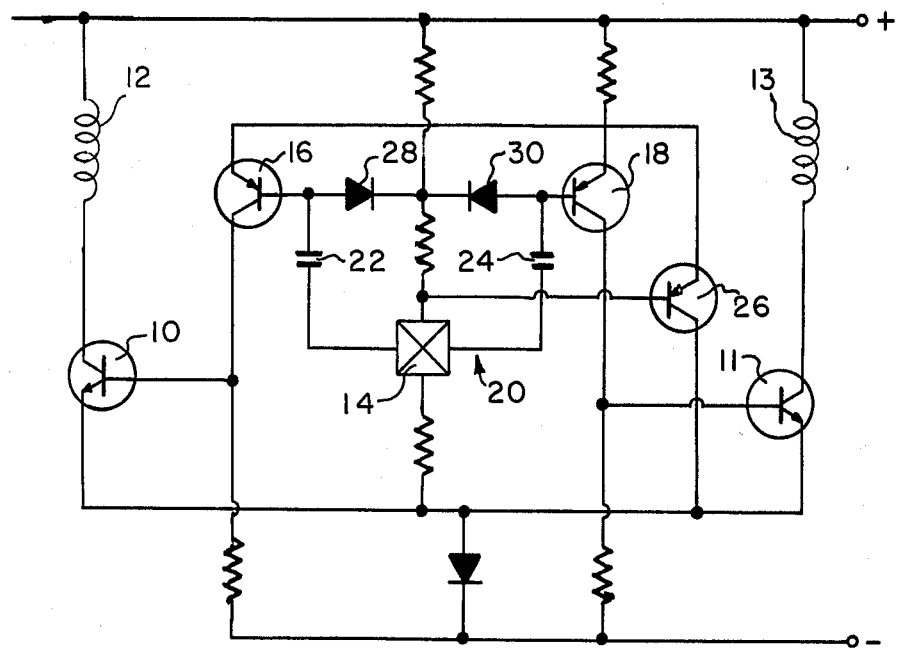
FIG. 1 shows a prior art drive circuit, as described above.
Figure 2:
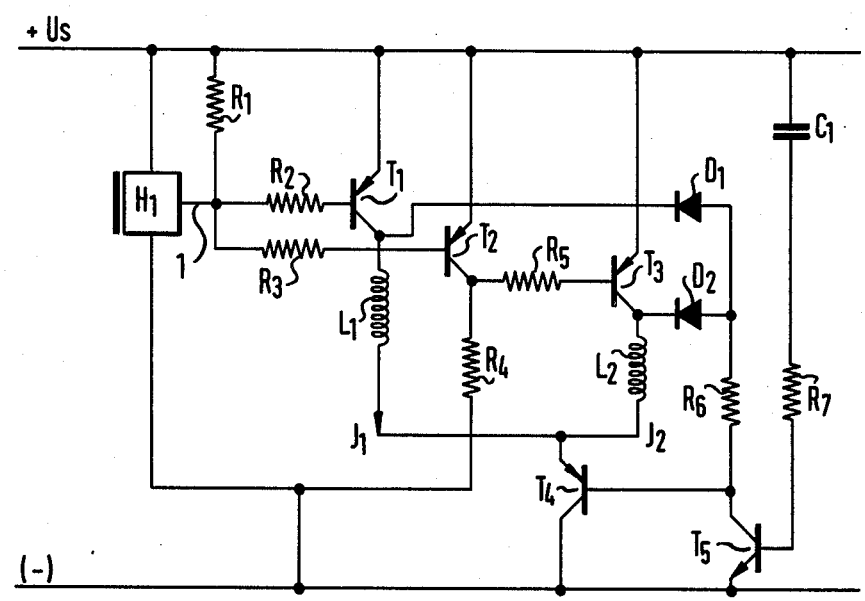
FIG. 2 shows a drive circuit formed according to the present invention for a two-phase brushless d.c. motor.

The drive circuit of the present invention is for brushless direct-current motors having a cylinder-like air gap between a permanent magnetic inner or outer rotor and a stator. As shown in FIG. 2 of the drawing, the d.c. motor has two stator windings $L_1$ and $L_2$, which are connected in each case through the emitter/collector paths of a first feed transistor $T_1$, and a second feed transistor $T_3$, respectively to a positive terminal $+u_s$ of a supply direct-current source. Each of the stator windings is connected through a common blocking protection transistor $T_4$ to a negative terminal $(-)$ of the supply direct-current source. The blocking protection transistor $T_4$ lies with its emitter/collector path in series with the stator windings $L_1$ and $L_2$, being connected between the common point of the stator windings and the negative terminal $(-)$ of the supply direct-current source.

For the determination of the rotor position of the d.c. motor, there is provided a semiconductor control element $H_1$ constructed preferably as a Hall-IC, which gives off position signals on an output 1, the position signals being dependent on the rotor position. These position signals are fed to the base of the feed transistor $T_1$ through a resistor $R_2$. These position signals are also fed to the base of the feed transistor $T_3$ through a resistor $R_3$ as well through both the base-collector path of a transistor $T_2$ operating as an inverter and a further resistor $R_5$ connected to the collector of the transistor $T_2$. A resistor $R_1$ connects the common point of the resistors $R_2$ and $R_3$ with positive terminal $+u_s$ of the supply direct-current source. Additionally, a resistor $R_4$ lies between the collector of the transistor $T_2$ and the negative terminal $(-)$ of the supply direct-current source.

The common point of each stator winding $L_1$ and $L_2$ with its associated feed transistor $T_1$ and $T_3$, respectively, is connected in each case through a diode $D_1$ and $D_2$ of its own, respectively, and a resistor $R_6$ to the base of the blocking protection transistor $T_4$. The resistor $R_6$ is connected to the common anode connection of the diodes $D_1$ and $D_2$. Between the resistor $R_6$ and the base of the blocking protection transistor $T_4$, there is further connected the collector of a starting transistor $T_5$ which provides for the automatic restarting of the motor. The starting transistor $T_5$ has its one emitter connected to the negative terminal $(-)$ of the supply direct-current source, and its base connected with the positive terminal $+u_s$ of the supply direct-current source through an RC circuit including a resistor $R_7$ and a capacitor $C_1$ connected in series therebetween.

For the description of the manner of functioning of the drive circuit represented herein, let there be taken as a starting point an operating state of the direct-current motor, in which the blocking protection transistor $T_4$ is in a conducting state. In this operating state of the motor, the semiconductor control element $H_1$ gives off position signals on its output 1 which go back to the magnetic field of the revolving rotor of the d.c. motor, and then pass through the resistors $R_1$ and $R_2$ to the base of the feed transistor $T_1$ and also pass through resistors $R_1$ and $R_3$ to the base of the inverter transistor $T_2$.

If, at this point, the output transistor of the magnetic field-sensitive control element $H_1$ is turned on, then its output 1 is at ground level. Thereby, the transistors $T_1$ and $T_2$ become conducting. Over the transistors $T_1$ and $T_4$ a current $J_1$ then flows through the stator winding $L_1$, while the inverter functioning of the transistor $T_2$ prevents the turning on of the transistor $T_3$ and, accordingly, the stator winding $L_2$ is not traversed by the current.

When the output transistor of the magnetic field-sensitive control element $H_1$ is blocked, then at its output 1 there exists a full operating voltage, and the transistors $T_1$ and $T_2$ thereby switch over to a blocked state. As a consequence of this blocking the current circuit for the stator winding $L_1$ is interrupting. By the blocking of the transistor $T_2$, the transistor $T_3$ can now turn on and thereby, through the transistor $T_4$, the transistor $T_3$ can supply the stator winding $L_2$ with a current $J_2$.

During the turning of the rotor, there arises an inductive voltage in each stator winding $L_1$ or $L_2$ during the blocking time of the feed transistor $T_1$ or $T_3$ associated with each of these stator windings. The inductive voltage conducts through the diode $D_1$ or $D_2$, respectively, to the base of the blocking protection transistor $T_4$, so that the blocking protection transistor $T_4$ is thus held in a conducting state.

If, at this point, the rotor is blocked, then the inductive voltage is no longer generated in either of the two stator windings $L_1$ and $L_2$, so that the transistor $T_4$ now blocks.

As a consequence of this blocking of the transistor $T_4$, the winding current characterized by the position of the magnetic field-sensitive control element $H_1$ and controlled through the transistors $T_1$ and $T_3$, respectively, is now interrupted. In this manner, it is ensured that on blocking of the rotor, no inadmissible heating of the feed transistors $T_1$ and $T_3$ or of the stator windings $L_1$ and $L_2$ can occur in consequence of excessive current load.

When the blocking of the rotor is eliminated, after a brief switch-off, there can occur a re-engagement.

When the operating voltage $u_s$ is again switched in, the transistor $T_5$ is kept conducting through the RC circuit connected to the base, from the resistor $R_7$ and the capacitor $C_1$, until the capacitor $C_1$ is charged. During this turning on of the transistor $T_5$, a negative potential is on the base of the transistor $T_4$, so that the transistor $T_4$, too, can turn on and the stator winding $L_1$ or $L_2$, characterized by the position of the magnetic field-sensitive control element $H_1$, is again traversed by the current.

The transistor $T_5$ will remain turned on until at a suitable rotating speed of the motor, the inductive voltage generated in the stator windings $L_1$ or $L_2$ will suffice to maintain the transistor $T_4$ in the conducting state. This is achieved by coresponding valves of the resistor $R_7$ and of the capacitor $C_1$. When the capacitor $C_1$ is charged, the base current of the transistor $T_5$ is interrupted and the transistor $T_5$, then blocks, so that further control of the transistor $T_4$ is taken over by the inductive voltage coupled through the diode $D_1$ or $D_2$ of the respective stator winding $L_1$ or $L_2$.

As can be directly perceived from the above description, thanks to the execution of the drive circuit according to the present invention, in case there is a blocking of the rotor, no inadmissably high current flux arises either in the stator windings or in any semiconductor element of the drive circuit.

What is claimed is:

1. A drive circuit for brushless direct-current motors having a cylinder-like air gap between a permanent magnetic inner or outer rotor and a stator, said drive circuit comprising stator windings connected to a supply direct-current source in series with respective feed transistors, in which current flux depends on position signals from a semiconductor control element determining the rotor setting, and on switching state of semiconductor switch means responding to blocking of the rotor and serving as blocking protection for said stator windings, said semiconductors switch means including a blocking protection transistor having an emitter/collector path in series with said stator windings and said feed transistors respectively associated with each of said stator windings, said blocking protection transistor having a base for receiving an inductive voltage generated in said stator windings.

2. A drive circuit according to claim 1, wherein said base of said blocking protection transistor is connected to one end of each stator winding through a respective diode for each stator winding.

3. A drive circuit according to claim 2, wherein said base of said blocking protection transistor is connected to each diode through a common resistor.

4. A drive circuit according to claim 3, wherein said base of said blocking protection transistor is connected to one terminal of said supply direct-control source through an emitter/collector path of a starting transistor, said starting transistor having a base connected through an RC circuit to the other terminal of said supply direct-current source.

5. A drive circuit according to claim 4, including two stator windings, said feed transistor associated with one of said stator windings being connected through a transistor acting as inverter to an output of said semiconductor control element.

6. A drive circuit according to claim 1, wherein said base of said blocking protection transistor is connected to one terminal of said supply direct-current source through an emitter/collector path of a starting transistor, said starting transistor having a base connected through an RC circuit to the other terminal of said supply direct-current source.

7. A drive circuit according to claim 1, including two stator windings, said feed transistor associated with one of said stator windings being connected through a transistor acting as an inverter to an output of said semiconductor control element.

* * * * *